United States Patent [19]
Tanimoto

[11] Patent Number: 4,743,872
[45] Date of Patent: May 10, 1988

[54] SWITCHED CAPACITOR CIRCUIT

[75] Inventor: Hiroshi Tanimoto, Kawasaki, Japan

[73] Assignee: Kabushiki Kaisha Toshiba, Kawasaki, Japan

[21] Appl. No.: 909,161

[22] Filed: Sep. 19, 1986

[30] Foreign Application Priority Data

Sep. 30, 1985 [JP] Japan .................................. 60-216491

[51] Int. Cl.[4] .............................................. H03H 7/01
[52] U.S. Cl. ........................................ 333/173; 330/9; 328/167
[58] Field of Search ................ 333/173, 213; 307/520; 330/107, 9, 109; 328/167, 127

[56] References Cited

U.S. PATENT DOCUMENTS

| | | | |
|---|---|---|---|
| 4,306,197 | 12/1981 | Gregorian | 333/107 |
| 4,344,050 | 8/1982 | Callahan | 333/173 |
| 4,498,063 | 2/1985 | Makabe et al. | 333/173 |
| 4,508,982 | 4/1985 | Kapral et al. | 333/167 X |
| 4,558,292 | 10/1985 | Sasaki et al. | 330/109 X |
| 4,623,854 | 11/1986 | Kuraishi | 333/173 |

FOREIGN PATENT DOCUMENTS

| | | | |
|---|---|---|---|
| 0017220 | 1/1982 | Japan | 333/173 |
| 0678644 | 8/1979 | U.S.S.R. | 333/173 |

OTHER PUBLICATIONS

T. Hui and D. J. Alstot, "MOS Switched Capacitor Highpass/Notch Ladder Filters," Proc. of International Symp on Circuits and Systems, Houston, TX, Apr. 1980, pp. 309-312.

"Modern Filter Design" by M. S. Ghausi & K. R. Laker (Prentice Hall 1981).

Primary Examiner—Eugene R. LaRoche
Assistant Examiner—Seung Ham
Attorney, Agent, or Firm—Oblon, Fisher, Spivak, McClelland & Maier

[57] ABSTRACT

A switched capacitor circuit comprises first and second switches connected in series between an input terminal and a first fixed potential terminal and third and fourth switches connected in series between an output terminal and the first fixed potential terminal. The group of the first and fourth switches and the group of the second and third switches are alternately rendered conducting and nonconducting. Two serial capacitors are connected between the junction of the first and second switches and the junction of the third and fourth switches and one parallel capacitor is connected between the junction of the two serially connected capacitors and the first fixed potential. The common junction of the three capacitors is connected to a second fixed potential terminal through a highly resistive element.

5 Claims, 5 Drawing Sheets

F I G. 10
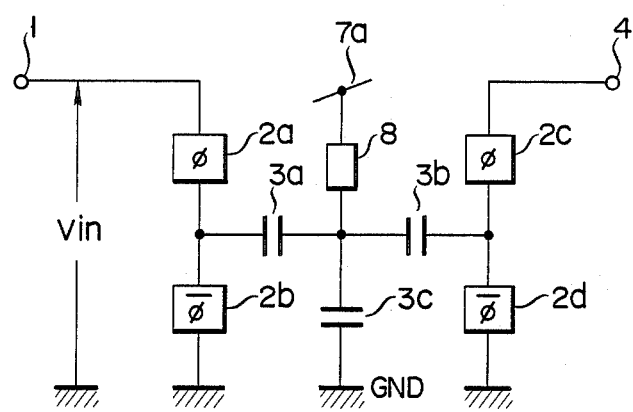

SWITCHED CAPACITOR CIRCUIT

BACKGROUND OF THE INVENTION

This invention relates to a switched capacitor circuit which constitutes an input signal integrating circuit together with a charge accumulator.

The input signal integrating circuit involves a switched capacitor circuit and a charge accumulator. The switched capacitor circuit is provided with at least one switch and at least one capacitor, and supplies a charge generated by an input signal to a charge accumulator. An output signal from the charge accumulator is delivered to another circuit. The above-mentioned input signal integrating circuit is widely accepted in the form of monolithic IC for the manufacture of a precise filter, A/D converter, and D/A converter. When one tries to fabricate a filter involving unit circuits each including a switched capacitor circuit and a charge accumulator, it is necessary to preset the time constant of a circuit composed of the unit circuits at a predetermined level in order to define the frequency characteristics of the filter.

A switched capacitor circuit is so designed as to control the charge or discharge of a capacitor by rendering switches conducting or nonconducting. An output signal from the switched capacitor circuit is transmitted to a charge accumulator. The time constant of, for example, an integrator composed of the capacitor and accumulator is defined by a product obtained by multiplying the ratio $C_O/C_Q$ (hereinafter referred to as "a capacitance ratio") by the switching period (T). The capacitance $C_Q$ represents the switched capacitor capacitance and $C_O$ represents the accumulator capacitor capacitance. When, therefore, a reciprocal $1/f_c$ of the filter cut-off frequency $f_c$ is tremendously larger than the switching period or when $C_Q$ of the filter has a large value, then aforementioned capacitor ratio $C_O/C_Q$ should be very much increased.

When, in the case of the monolithic IC, the above-mentioned capacitor ratio is determined by the capacitors formed on a semiconductor chip, the precision of the capacitor ratio is further deteriorated as the capacitance of the capacitor $C_Q$ of the switched capacitor circuit is reduced. This event arises from problems occurring in the manufacture of IC's. Namely, the capacitance of a unit capacitor formed on a chip is defined by the IC-manufacturing technique. To attain the predetermined capacity ratio, therefore, it is necessary to use for the accumulator the capacitor whose capacitance has a value arrived at by multiplying the capacitance of the unit capacitor by the aforesaid predetermined capacity ratio. If, therefore, it is attempted to attain a large capacity ratio, the total sum of capacitances of the capacitors will be enormously enlarged, thus causing the capacitors to occupy a large area on the chip.

In view of the above-mentioned technical circumstances, a process has been developed which is designed to reduce the equivalent capacitance of the capacitors involved in a switched capacitor circuit (the capacitance of the switched capacitor circuit defining the capacitance ratio). An article entitled "A method of equivalent circuit transformation on a Switched Capacitor Filter" appears in a collection of manuscripts of lectures given at the national convention (1981) of the information system department of the Institute of Electronics and Communication Engineers of Japan. The article sets forth means for increasing the capacitor ratio of a filter by connecting three capacitors in ladder form.

Description may now be made of the summary of the article with reference to FIG. 1.

First and second switches 2a, 2b are connected between input signal terminal 1 and the ground. Third and fourth switches 2c, 2d are connected between output terminal 4 (connected, for example, to a charge accumulator) and the ground. Serial capacitors 3a, 3b are connected between the junction of switches 2a, 2b and the junction of switches 2c, 2d. Capacitor 3c is connected between the junction of capacitors 3a, 3b and the ground. Switch 2e is connected in parallel to capacitor 3c. Now let it be assumed that switches 2a, 2d are rendered conducting, and switched 2b, 2c, 2e are rendered nonconducting, thereby charging capacitors 3a, 3b, 3c. Then 2a, 2d are rendered nonconducting and switches 2b, 2c, 2e are rendered conducting, thereby short circuiting capacitors 3a, 3c. Then the electric charge of capacitor 3b alone is transmitted, for example, to a charge accumulator connected to terminal 4. The above-mentioned process offers the advantage that the equivalent capacitance of a switched capacitor circuit contributing to the determination of the aforementioned capacity ratio reaches a value $(C_a + C_b + C_c)/C_a$ which results when capacitor 3a alone is used. As a result, the total capacity required to obtain the predetermined capacity ratio is noticeably decreased. In this case, $C_a$, $C_b$, $C_c$ respectively represent the capacitances of the capacitors 3a, 3b, 3c.

The conventional switched capacitor circuit shown in FIG. 1 is accompanied with the undermentioned drawbacks. Namely, switches 2a to 2e are formed of MOS FETs. As seen from FIG. 2, the MOS FET has stray capacitances $C_{gd}$, $C_{gs}$, $C_{db}$ and $C_{sb}$ between the electrodes of gate G, drain D, source S, and back gate B (substrate). These stray capacitances exert the undermentioned harmful effect on a switched capacitor circuit. To begin with, these stray capacitances give rise to an error in the aforementioned capacitance ratio. In the second place, a clock signal supplied to the gate G leaks into the switched capacitor circuit through stray capacitances $C_{gs}$, $C_{gd}$. When the leaked signal is brought into the switched capacitor circuit of the succeeding filter connected to a filter involving the switched capacitor circuit FIG. 1, and is subjected to sampling by the same frequency as that of the preceding filter, then a D.C. component is sometimes generated in the succeeding filter. In the third place, noises resulting from power source leak from back gate B into the switched capacitor circuit through stray capacitances $C_{db}$, $C_{sb}$. These noises, even if composed of a frequency component falling outside of the frequency zone of an input signal, tend to be changed in the switched capacitor circuit into noises possessing a frequency component falling within the input signal frequency zone, thus deteriorating the S/N ratio of the filter circuit. Particularly since the capacitor circuit and the circuit for producing a switch-controlling clock signal are formed in the same chip, the power source is contaminated by noises having tremendously high frequency components.

SUMMARY OF THE INVENTION

It is accordingly the object of this invention to provide a switched capacitor circuit, which, when an input signal integrating circuit is formed, ensures a large capacity ratio without increasing the total capacitance of the capacitors, and eliminates harmful effects exerted by the stray capacitances of the switches.

According to this invention, a switched capacitor circuit having an input signal terminal and an output signal terminal comprises first and second switches connected in series between the input signal terminal and a first fixed potential terminal, and third and fourth switches connected between the output signal terminal and the first fixed potential terminal. The conduction and nonconduction of the first switch being controlled by a first clock pulse having a first phase, the conduction and nonconduction of the second switch being controlled by a second clock pulse having a second phase reversed from the first phase, the conduction and nonconduction of the third switch being controlled by one of the first and second clock pulses, and the conduction and nonconduction of the fourth switch being controlled by the other of the first and second clock pulses; a capacitor circuit including at least two capacitors connected in series between the junction of the first and second switches and the junction of the third and fourth switches; at least one parallel capacitor connected between the junction of the two serial capacitors and the first fixed potential terminal; and highly resistive element means connected between the junction of the two serial capacitors and a second fixed potential terminal.

BRIEF DESCRIPTION OF THE DRAWINGS

FIG. 10 is a switched capacitor circuit according to a third embodiment of the invention.

DETAILED DESCRIPTION OF THE PREFERRED EMBODIMENTS

Figure 3:
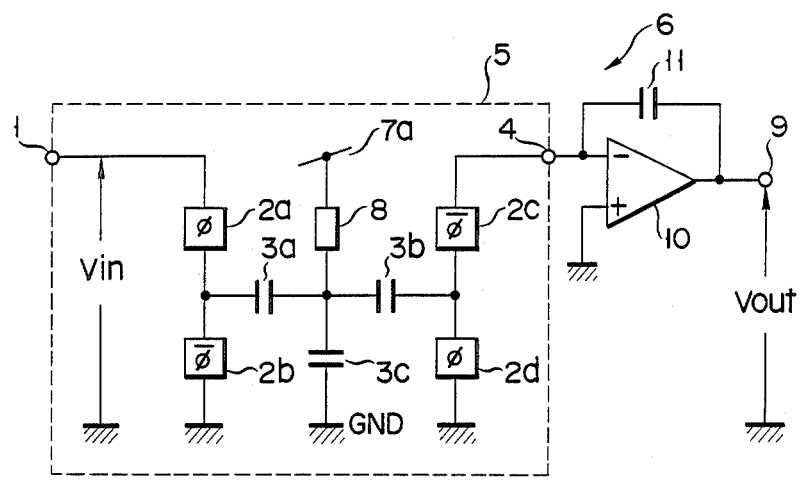
FIG. 3 indicates a switched capacitor filter including a switched capacitor circuit according to a first embodiment of the present invention.

FIG. 3 illustrates a switched capacitor filter circuit involving switched capacitor circuit 5 and charge accumulator 6 according to a first embodiment of the present invention. The switched capacitor circuit 5 involves first and second switches 2a, 2b connected in series between input signal terminal 1 (supplied with input signal Vin) and first potential terminal (ground) and third and fourth switches 2c, 2d connected between output terminal 4 and first fixed potential terminal. Serial capacitors 3a, 3b are connected between the junction of switches 2a, 2b and the junction of switches 2c, 2d. A parallel capacitor 3c is connected between the junction of serial capacitors 3a, 3b and first fixed potential terminal. Highly resistive element 8 is connected between the junction of serial capacitors 3a, 3b and second fixed potential terminal (for example, a positive source). Charge accumulator 6 comprises operational amplifier 10 wherein a positive input terminal is connected to a first fixed potential terminal, a negative input terminal is connected to output terminal 4 of the switched capacitor circuit, and an output is connected to filter output terminal 9, and integrating capacitor 11 is connected between terminals 4 and 9.

Figure 1:
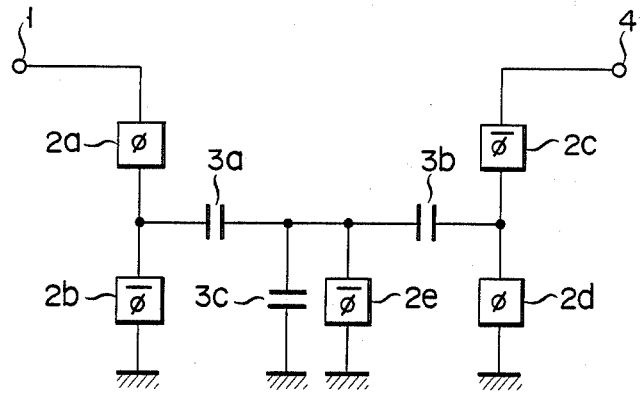
FIG. 1 shows an example of a prior art switched capacitor circuit.
Figure 2:
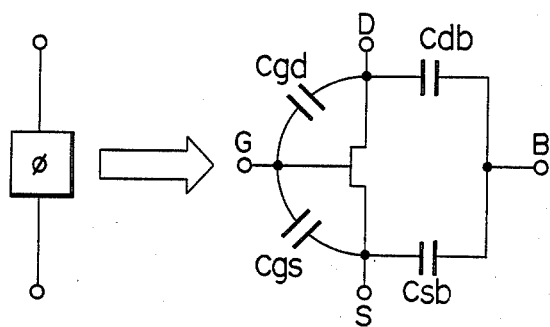
FIG. 2 illustrates stray capacitances prevailing in the MOS transistor switches of FIG. 1.

Switched capacitor circuit 5 of FIG. 3 has the undermentioned different arrangement from the conventional switched capacitor circuit of FIG. 1. Namely, switch 2e connected in parallel to capacitor 3c, of FIG. 1 is eliminated from FIG. 3. In FIG. 3, the junction of capacitors 3a, 3b is connected to second fixed potential terminal 7a through highly resistive element 8. In FIG. 1, switch 2e is connected in parallel to capacitor 3c, thus preventing the T to $\pi$ conversion of capacitors 3a, 3b, 3c. In contrast, the switched capacitor circuit of FIG. 3 embodying this invention ensures the T to $\pi$ conversion of capacitors 3a, 3b, 3c.

Figure 4:
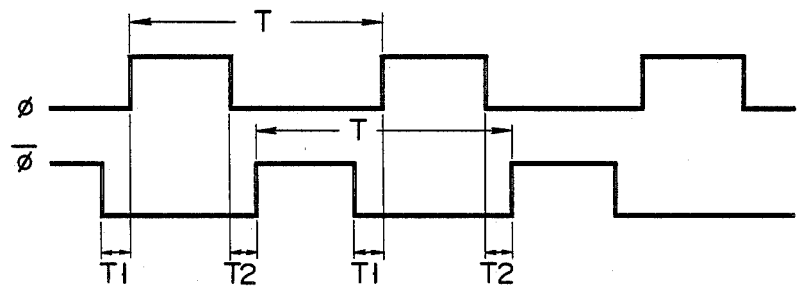
FIG. 4 sets forth the waveforms of clock signals controlling the conduction and nonconduction of the switches of FIG. 3.

Description may now be made of the operation of the switched capacitor filter of FIG. 3. The conduction and nonconduction of first and fourth switches 2a, 2d are controlled by first clock signal $\phi$ shown in FIG. 4. The conduction and nonconduction of second and third switches 2b, 2c are controlled by second clock signal $\bar{\phi}$ indicated in FIG. 4. Said clock signals $\phi$, $\bar{\phi}$ have a period T and have pulses of opposite phases. Nonoverlapping periods $T_1$, $T_2$ are present between the pulses of opposite phases. The nonoverlapping periods $T_1$, $T_2$ may have the same or different durations. During the period in which clock signal $\phi$ has "H" level, and clock signal $\bar{\phi}$ has "L" level, switches 2a, 2d are closed, and switches 2b, 2c are opened. Therefore, input signal voltage Vin is divided into two components by capacitors 3a, 3c. Capacitor 3b is charged by one of the two divided voltage components. During the period in which clock signal $\phi$ has "L" level, and clock signal $\bar{\phi}$ has "H" level, switches 2b, 2c are closed, and switches 2a, 2d are opened. As a result, charges stored in capacitors 3a, 3c are released. A charge stored in capacitor 3b alone is transmitted to integrating capacitor 11 by means of operational amplifier 10.

Capacitors 3a, 3b, 3c, connected in the ladder or T type, allow for the aforementioned T to $\pi$ conversion. Namely, as seen from FIG. 5, the capacitors 3a, 3b, 3c can be converted to $\pi$ type capacitor network including capacitors $3_P$, $3_Q$, $3_R$. Now let it be assumed that the capacitances of capacitors $3_P$, $3_Q$, $3_R$ are respectively represented by $C_P$, $C_Q$, $C_R$ and the capacitances of capacitors 3a, 3b, 3c are respectively denoted by Ca, Cb, Cc. Then the following equations result:

$$C_P = \frac{CaCc}{Ca + Cb + Cc} \quad (1)$$

$$C_Q = \frac{CaCb}{Ca + Cb + Cc} \quad (2)$$

$$C_R = \frac{CcCb}{Ca + Cb + Cc} \quad (3)$$

A capacitance contributing to the transfer of charges corresponding to input signal voltage Vin to charge accumulator 6 is equivalently represented by $C_Q$. As seen from above equation (2), capacitance $C_Q$ is smaller than each of capacitances Ca, Cb, Cc. It is therefore evident that the capacitance ratio $C_o/C_Q$ can be enlarged. In this case, Co represents the capacitance of capacitor 11. For the reason given above, it is evident that when a filter is prepared from monolithic IC, the areas occupied by capacitors on the chip can be reduced.

The transfer function H(Z) of the filter shown in FIG. 3 is indicated by the following equation 4:

$$H(Z) = \frac{\frac{CaCb}{Ca + Cb + Cc}}{Co} \cdot \frac{Z^{-1}}{1 - Z^{-1}} \quad (4)$$

where:

$Z = e^{j\omega T}$ (where $\omega$ represents the angular frequency of input signal voltage Vin, and T represents the switching period of the switches).

Figure 5:
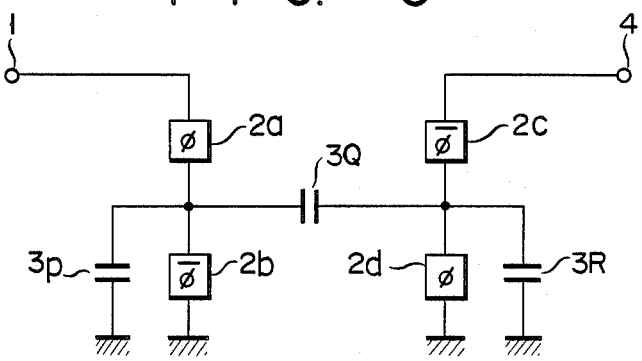
FIG. 5 shows an equivalent circuit realized when the capacitors of the switched capacitor circuit of FIG. 3 is subjected to the T−$\pi$ conversion.

Referring to FIG. 5, the presence of stray capacitors $3_P$, $3_R$ can be neglected with respect to the above-mentioned charge transfer. Consequently errors in the capacitance ratio $Co/C_Q$ which are caused by the stray capacitors $3_P$, $3_R$ can be neglected. The reason is as follows. While, in FIG. 5, switches 2a, 2d are closed and switches 2b, 2c are opened (first condition), capacitors $3_P$, $3_Q$ alone are charged up to input signal voltage Vin, but capacitor $3_R$ is not charged. While switches 2a, 2d are opened and switches 2b, 2c are closed (second condition), the capacitor $3_P$ which was charged during the first condition is discharged through switch 2b. Only the electric energy charged in capacitor $3_Q$ during the first condition is transferred to capacitor 11.

In the conventional switched capacitor circuit of FIG. 1, it is impossible to carry out the T to $\pi$ conversion of capacitors 3a, 3b, 3c. Therefore the stray capacitance of switch 2e harmfully affects the capacitance of capacitor 3c, resulting in errors in the capacitance ratio. In contrast, the switched capacitor circuit of FIG. 3 embodying the present invention offers the advantage that the stray capacitances of switches 2a to 2d do not adversely effect the operation of the switched capacitor circuit. This means that the capacitor ratio can be increased without deteriorating the S/N ratio of the filter.

If, in FIG. 1, switch 2e is simply removed, then the potential of the common junction of capacitors 3a, 3b, 3c is brought to a floating state. As long as no charge is supplied to the common junction, the potential of the junction remains unchanged. If, however, the charge of the common junction is varied by some cause, the potential of the junction also changes, probably leading to the puncture of capacitors 3a to 3c. To eliminate the above-mentioned drawback accompanying the conventional switched capacitor circuit, the present invention is characterized in that highly resistive element 8 is connected between the common junction of capacitors 3a to 3c and second fixed potential terminal 7a, thereby fixing the DC potential level of the common junction. The common junction is not connected to any other element than second fixed potential terminal 7a, thus making it possible to render the charge at the common junction always constant, and consequently ensuring the equivalent conversion from FIG. 3 to FIG. 5. If resistive element 8 is set at so high a resistive level as to render the time constant of a circuit involving the capacitance provided with the common junction and the resistive element 8 fully longer than the aforementioned period T in which switches 2a to 2d are respectively opened and closed, then resistive element 8 will exert no harmful effect on the operation of the filter.

The effect of the switched capacitor circuit of FIG. 3 embodying the present invention may be summarized as follows. A divided signal denoting the component of the input signal voltage divided by the ladder type capacitors can be transmitted to a charge accumulator. Even if, therefore, the total capacitance of the capacitors is reduced, the capacitance ratio can be increased. Since the T to $\pi$ conversion of the capacitors involved in the switched capacitor circuit is realized, the effect of the stray capacitances resulting from the switches can be substantially overlooked. Since the common junction of the ladder type capacitors is connected to the second fixed potential terminal through the highly resistive element 8, the puncture of the capacitors can be prevented. Further, since the highly resistive element constitutes a low pass filter together with the capacitors, offering the advantage that even when the second fixed potential source involves noises having a wide frequency band, it is possible to suppress the harmful effect of the noises on the switched capacitor circuit.

Figure 6:
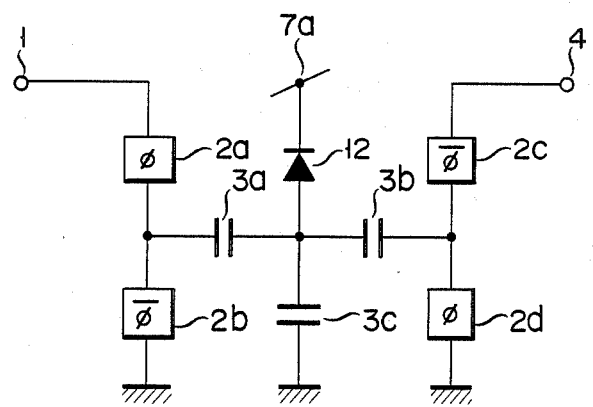
FIG. 6 indicates circuit representing a modification of the switched capacitor circuit of FIG. 3.

The highly resistive element 8 of FIG. 3 may be provided by pn junction diode 12 shown in FIG. 6. The anode of the diode 12 is connected to the common junction of capacitors 3a, 3b, 3c. The cathode of the diode 12 is connected to positive fixed potential terminal 7a. If positive charges happen to be accumulated at the common junction of the capacitors, and the potential of the common junction exceeds the potential level of fixed potential terminal 7a, then diode 12 is forwardly biased, thereby preventing positive charges from being further accumulated at the common junction, and consequently suppressing the puncture of capacitors 3a to 3c. While no charge accumulation takes place at the aforementioned common junction, diode 12 retains the condition of reversed bias and holds a tremendously high resistance, thus exerting no adverse effect on the operation of the switched capacitor circuit. While holding the condition of reversed bias, diode 12 has a resistance of the order of $10^{12}\Omega$, and IC monolithic switched capacitor circuit has a capacitance of the order of $10^{-12}$ F. Therefore, the time constant of the filter circuit is about $10^0$ sec. Since, therefore, the widely accepted clock signal has a frequency of over about $10^4$ Hz, the time constant of the above-mentioned magnitude is fully sufficient for the filter.

When aforesaid highly resistive element 8, for example, diode 12 is provided, then the highly resistive element 8 and capacitors 3a to 3c jointly constitute a low pass filter having the aforementioned time constant, wherein fixed potential terminal 7a constitutes an input terminal and the common junction of capacitors 3a to 3c represents an output terminal. Even if, therefore, fixed potential terminal 7a is supposedly contaminated by noises having wide band frequencies, the low pass filter eliminates high frequencies. Consequently, the switched capacitor circuit is harmfully affected only by those components of the noises which have tremendously low frequencies.

Figure 7:
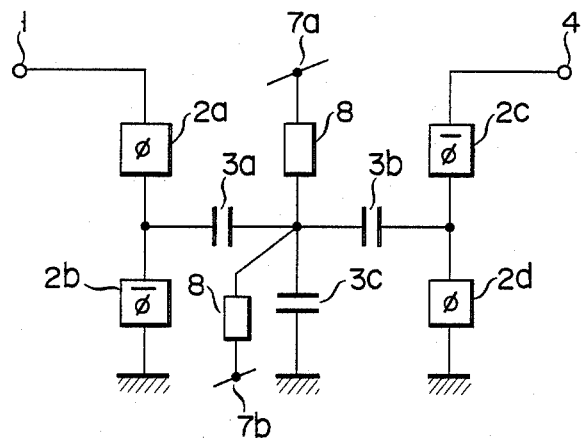
FIG. 7 illustrates a circuit representing another modification of the switched capacitor circuit of FIG. 3.

The same advantageous effect as described above can be ensured by connecting, as shown in FIG. 7, the common junction of capacitors 3a, 3b, 3c to second fixed potential terminal 7a through a highly resistive element 8 as well as to third fixed potential terminal 7b through another highly resistive element 8. In this case, second and third fixed potentials are allowed to have different polarities or levels.

Figure 8:
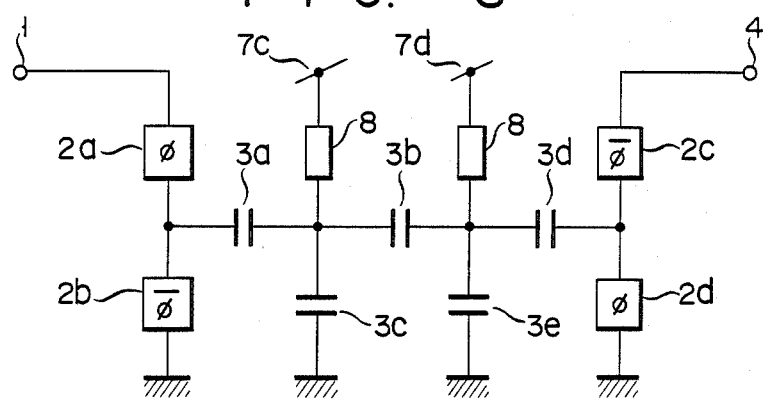
FIG. 8 sets forth a switched capacitor circuit according to a second embodiment of the invention.

Description may now be made with respect to FIG. 8 of a switched capacitor circuit according to a second embodiment of the present invention. Three serial capacitors 3a, 3b, 3d are connected between the junction of switches 2a, 2b and the junction of switches 2c, 2d. Further, parallel capacitor 3c is connected between the junction of capacitors 3a, 3b and a first fixed potential terminal. And parallel capacitor 3e is connected between the junction of capacitors 3b, 3d and the first fixed potential terminal. The junction of capacitors 3a, 3b is connected to fixed potential terminal 7c through highly resistive element 8. The junction of capacitors 3b, 3d is connected to fixed potential terminal 7d through highly resistive element 8.

Figure 9A:
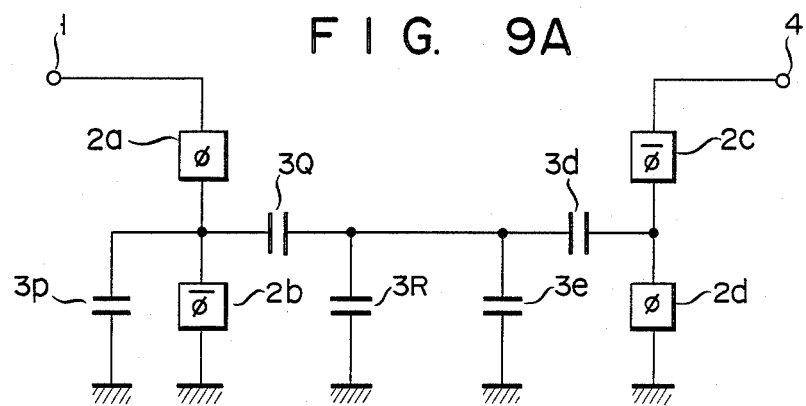
FIGS. 9A and 9B are respectively the equivalent circuits of the switches and capacitors of FIG. 8.
Figure 9B:
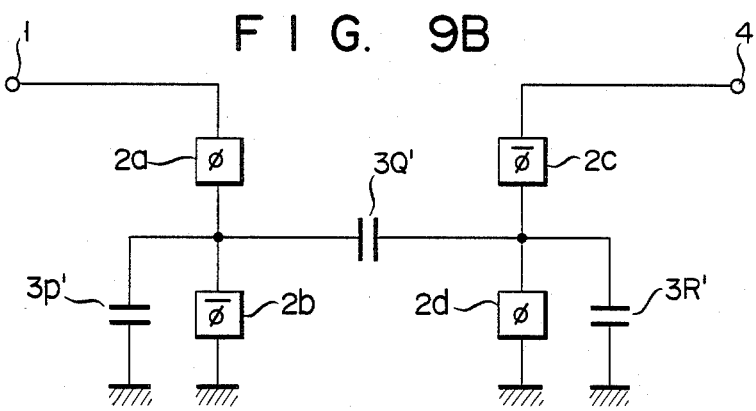

The $T-\pi$ conversion of the ladder type capacitors of FIG. 8 provides an equivalent circuit indicated in FIG. 9A. In FIG. 9A, the capacitors 3a, 3b, 3c of FIG. 8 are respectively represented by $3_P$, $3_Q$, $3_R$ as a result of the $T-\pi$ conversion. When the combination of capacitor $3_Q$, parallel connected capacitors $3_R$ and 3e, capacitor 3d of FIG. 9A is again subjected to the $T-\pi$ conversion, then the equivalent circuit of FIG. 9B results. In FIG. 9B, capacitors $3_{P'}$, $3_{Q'}$, $3_{R'}$ respectively correspond to capacitors $3_P$, $3_Q$, $3_R$ of FIG. 5. Therefore, FIG. 8 has the same operation and effect as the switched capacitor circuit of FIG. 3.

If, in FIG. 8 serial capacitors are increased in number to provide, for example, a filter, then the capacitance ratio will be further increased.

If, in FIG. 3, clock pulses for controlling third and fourth switches are respectively $\phi$, $\bar{\phi}$, with clock pulses for controlling first and second switches respectively indicated by $\phi$, $\bar{\phi}$, then the resultant switched capacitor circuit (shown in FIG. 10) is obviously included in the scope of the present invention.

What is claimed is:

1. A switched capacitor circuit provided with an input signal terminal and an output signal terminal which comprises:

first and second switches connected in series between said input signal terminal and a first fixed potential terminal and third and fourth switches connected in series between said output signal terminal and said first fixed potential terminal, said first switch being controlled by a first clock pulse having a first phase, said second switch being controlled by a second clock pulse having a second phase reversed from said first phase, said third switch being controlled by one of said first and second clock pulses, and said fourth switch being controlled by the other of said first and second clock pulses;

a capacitor circuit including at least two serial capacitors connected between the junction of said first and second switches and the junction of said third and fourth switches and at least one parallel capacitor connected between the junction of said two serial capacitors and said first fixed potential terminal; and highly resistive element means connected between the junction of said two serial capacitors and a second fixed terminal.

2. A switched capacitor circuit according to claim 1, wherein said highly resistive element means comprises a pn junction diode.

3. A switched capacitor circuit according to claim 1, wherein said highly resistive element means comprises a first highly resistive element connected between the junction of said two serial capacitors and said second fixed potential terminal and a second highly resistive element connected between said junction and a third fixed potential terminal.

4. A switched capacitor circuit according to claim 3, wherein said second fixed potential and third fixed potential have different levels and polarities.

5. A switched capacitor circuit according to claim 1, wherein said capacitor circuit includes first to third serial capacitors connected between the junction of said first and second switches and the junction of said third and fourth switches, a first parallel capacitor connected between the junction of said first and second serially connected capacitors and said first fixed potential terminal, and a second parallel capacitor connected between the junction of said second and third serially connected capacitors and said first fixed potential terminal; and said highly resistive element means includes a highly resistive element connected between the junction of said first and second serially connected capacitors and a second fixed potential terminal and another highly resistive element connected between the junction of said second and third serially connected capacitors and a third fixed potential terminal.

* * * * *